United States Patent
Bruneau et al.

(10) Patent No.: US 11,859,283 B2
(45) Date of Patent: Jan. 2, 2024

(54) HETEROALKYLCYCLOPENTADIENYL INDIUM-CONTAINING PRECURSORS AND PROCESSES OF USING THE SAME FOR DEPOSITION OF INDIUM-CONTAINING LAYERS

(71) Applicant: L'Air Liquide, Société Anonyme pour l'Etude et l'Exploitation des Procédés Georges Claude, Paris (FR)

(72) Inventors: Antoine Bruneau, Liffre (FR); Takashi Ono, Yokosuka (JP); Christian Dussarrat, Tokyo (JP)

(73) Assignee: L'Air Liquide Societe Anonyme Pour L'Etude Et L'Exploitation Des Procedes Georges Claude, Paris (FR)

( * ) Notice: Subject to any disclaimer, the term of this patent is extended or adjusted under 35 U.S.C. 154(b) by 594 days.

(21) Appl. No.: 16/941,088

(22) Filed: Jul. 28, 2020

(65) Prior Publication Data

US 2022/0033966 A1 Feb. 3, 2022

(51) Int. Cl.
C23C 16/18 (2006.01)
C23C 16/455 (2006.01)
C07F 5/00 (2006.01)

(52) U.S. Cl.
CPC .......... C23C 16/45514 (2013.01); C07F 5/00 (2013.01); C23C 16/18 (2013.01)

(58) Field of Classification Search
CPC .......................... C23C 16/18; C23C 16/45514
See application file for complete search history.

(56) References Cited

U.S. PATENT DOCUMENTS

2008/0102205 A1* 5/2008 Barry ............... C23C 16/18
427/250
2020/0181775 A1* 6/2020 Mizutani ........... H01L 31/1884

FOREIGN PATENT DOCUMENTS

| JP | H03 88324 | 4/1991 |
|---|---|---|
| JP | 2018 090855 | 6/2018 |
| WO | WO 2018 225668 | 12/2018 |
| WO | WO 2019 133251 | 7/2019 |
| WO | WO 2020 179748 | 9/2020 |

OTHER PUBLICATIONS

Beachley, Jr., O.T. et al., (Pentamethylcyclopentadienyl)indium(I) and—indium(III) compounds. Syntheses, reactivities, and x-ray diffraction and electron diffraction studies of $In(C_5Me_5)$, Organometallics 1989, 8, 346-356.

Bensiek, S. et al., Synthesis, structure, and significance for MOCVD of intramolecularly base-stabilized monomeric cyclopentadienylaluminum and—gallium dihiydrides, Organometallics 2000, 19, 1292-1298.

Mizutani, F. et al., Atomic layer deposition of stoichiometric in $In_2O_3$ films using liquid ethylcyclopentadienyl indium and combinations of $H_2O$ and $O_2$ plasma, AIP Advances 9, 045019 (2019).

Jutzi, P. et al., Synthesis and properties of Group 13 element compounds (Al, Ga, In) with the polydentate 1-[2-(dimethylamino)ethyl]-2,3,4,5-tetramethylcyclopentadienyl ligand. X-ray crystal structures of $(C_5Me_4CH_2CH_2NMe_2)MX2$ ($MX_2$ =$AlMe_2$, $AlCl_2$, $InCl_2$)$^1$, Organometallics, 1996, 15, 747-752.

International Search Report and Written Opinion for corresponding PCT/US2021/043507, dated Oct. 26, 2021.

\* cited by examiner

*Primary Examiner* — Elizabeth A Burkhart
(74) *Attorney, Agent, or Firm* — Yan Jiang

(57) ABSTRACT

Methods for forming an Indium-containing film by a vapor deposition method using a heteroalkylcyclopentadienyl Indium (I) precursor having a general formula:

$In[R^1R^2R^3R^4CpL^1]$ or $In[CpL^1L^2_y]$ wherein Cp represents a cyclopentadienyl ligand; $R^1$ to $R^4$ are each independently H, $C_1$-$C_4$ linear, branched or cyclic alkyls; $L^1$ and $L^2$ are each independently a substituent bonded to the Cp ligand and consisting of an alkyl chain containing at least one heteroatom, such as Si, Ge, Sn, N, P, B, Al, Ga, In, O, S, Se, Te, F, Cl, Br, I; and y=1-4. Examplary heteroalkylcyclopentadienyl Indium (I) precursors include $In(Cp(CH_2)_3NMe_2)$ or $In(CpPiPr_2)$.

14 Claims, No Drawings

HETEROALKYLCYCLOPENTADIENYL INDIUM-CONTAINING PRECURSORS AND PROCESSES OF USING THE SAME FOR DEPOSITION OF INDIUM-CONTAINING LAYERS

TECHNICAL FIELD

The present invention relates to indium (In)-containing film forming compositions comprising In(I) precursors, in particular, heteroalkylcyclopentadienyl indium precursors, and methods of synthesizing them and using them for deposition of In-containing films.

BACKGROUND

In semiconductor industry, indium-containing films doped with other elements are commonly used in optoelectronic devices due to their higher electron mobility. For example, indium tin oxide InSnO (ITO) has been used as an electrode in a liquid crystal display (LCD) for a long time. More recently, a material called InGaZnO (IGZO), i.e. containing indium, gallium, and zinc in a transparent thin film transistor, has been implemented in certain types of thin film transistors (TFT). Oxygen-free thin films of indium have also been widely studied and used in various optoelectronic devices. For example, III-V semiconductors, e.g., InN, InP, InAs, InSb, are known to have high electron mobility, direct band gap, and low exciton binding energy making them widely used for high-performance optoelectronic devices. In addition, $InS_x$ such as InS or $In_2S_3$, are mid-bandgap semiconductors that may be useful in passivating the surface of III-V compounds.

Such optoelectronic devices require very well defined, homogeneous thin film layers to better control their performances and optimize their size. Historically, sputtering techniques were employed to deposit indium but this technology requires harsh conditions, i.e. very high vacuum. Nowadays, these thin Indium oxide layers are made using chemical vapor deposition (CVD), plasma-enhanced atomic layer deposition (PEALD). A key parameter for industrial applications is to develop liquid indium-containing precursors at 80° C. or less because it is more practical to prepare, to fill in a storing canisters, to deliver into a reactor through feeding lines and exhaust lines for liquid indium-containing precursors. The use of a solid precursor requires a sublimator for vapor formation that typically needs to be replaced at least once a day in production conditions and generates feed rates that may also fluctuate because of the variation of grain sizes during the sublimation. In addition, for safety reasons, the indium-containing precursors would preferably not be spontaneously flammable upon air exposure. The indium-containing precursors should not contain halides that may degrade the electrical conductivity of the indium-containing film resulting from its process. The most suitable precursors to deposit such indium-containing layers include derivatives from In(III): $InCl_3$, $In(Me)_3$ (aka TMI), $In(Et)_3$ (aka TEI), $In(Ac)_3$, [3-(dimethylamino)propyl]dimethyl indium (aka DADI). Mizutani et al. disclose at a temperature range between 100 and 500° C., the deposition of such precursors led to growth per cycle (GPC) below 1 Å/cycle (Mizutani et al., AIP Advances, 2019, 9, 045019). In order to minimize the amount of indium-containing precursor used in such process, higher GPCs are desired. Mizutani et al. and WO2018225668A also disclose In(I) precursors, bearing cyclopentadienyl type ligands with R=alkyl substituent (In-RCp). These have been recently recognized as the better precursors to obtain a high GPC (>1 Å/cycle). Unfortunately, the GPC performance of these precursors drops dramatically at temperatures below 200° C., also leading to films with high carbon contamination (10 to 20%). Therefore, the search for new precursors allowing deposition at a temperature lower than 200° C., preferably lower than 150° C., more preferably at about 100° C., resulting in GPC higher than 0.3 Å/cycle and with low carbon contamination is needed. One application of such material could be the deposition of indium-containing layer on polymer with melting point lower than 200° C. Beachley et al. disclose that InCp* ($In(C_5Me_5)$) slightly decomposes in the presence of donor solvents (Organometallics 1989, 8, 346-356). Jutz et al. disclose, (Jutzi, et al., Organometallics, 2000, 19, 1292-1298), the presence of heteroalkyl group on the Cp could decrease reactivity toward moisture and air in comparison to non-donor stabilized Cp group 13 element compounds.

SUMMARY

Disclosed are methods for forming an Indium-containing film, the method comprising the steps of:
exposing a substrate to a vapor of a film forming composition; wherein the film forming composition comprises a heteroalkylcyclopentadienyl Indium (I) precursor having a general formula:

$In[R^1R^2R^3R^4CpL^1]$ or 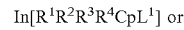

$In[CpL^1L^2_y]$ 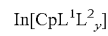

wherein Cp represents a cyclopentadienyl ligand; $R^1$ to $R^4$ are each independently H, $C_1$-$C_4$ linear, branched or cyclic alkyls; $L^1$ and $L^2$ are each independently a substituent bonded to the Cp ligand and consisting of an alkyl chain containing at least one heteroatom, such as Si, Ge, Sn, N, P, B, Al, Ga, In, O, S, Se, Te, F, Cl, Br, I; and y=1-4; and
depositing at least part of the heteroalkylcyclopentadienyl Indium(I) precursor onto the substrate to form the Indium-containing film using a vapor deposition method. The disclosed methods may include one or more of the following aspects:
the vapor deposition method being ALD, CVD or a combination thereof;
the vapor deposition process being a PEALD process or a spatial ALD process;
$L^1$ and $L^2$ being each independently a —$(C_kH_l$-$ER_m)$ group, wherein —$C_kH_l$ is a linear, cyclic or branched alkyl chain; k=0-6; l=0-11; E=Si, Ge, Sn, N, P, B, Al, Ga, In, O, S, Se, Te, F, Cl, Br, I; R is H, a $C_1$-$C_5$ linear, cyclic or branched alkyl;
the heteroalkylcyclopentadienyl Indium(I) precursor being selected from the group consisting of

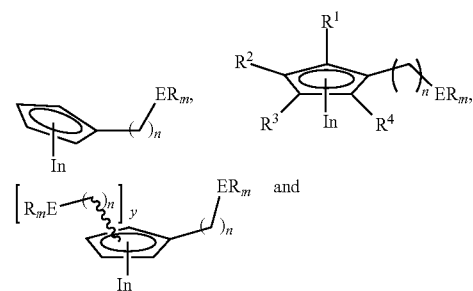

-continued

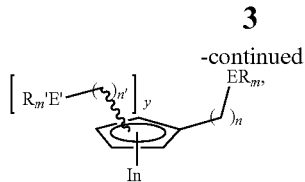

wherein n and n' are each independently 0 to 6, linear, representing $C_0$ to $C_6$ cyclic or branched alkyl chain; E and 'E' are each independently Si, Ge, Sn, N, P, B, Al, Ga, In, O, S, Se, Te, F, Cl, Br, I; R=H, a $C_1$ to $C_5$ linear, branched or cyclic alkyl, or a heteroalkyl; $R^1$ to $R^4$ are independently H, $C_1$-$C_4$ linear, branched or cyclic alkyls; m=0 to 4; y=1 to 4;
the heteroalkylcyclopentadienyl Indium(I) precursor being

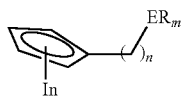

wherein n is 0 to 6 representing a $C_0$ to $C_6$ linear, cyclic or branched alkyl chain; E=N, P, B, O, S, F; R=H, a $C_1$ to $C_5$ linear, branched or cyclic alkyl, or a heteroalkyl; m=0 to 4; $R^1$ to $R^4$ are each H;
the heteroalkylcyclopentadienyl Indium(I) precursor being selected from In[Cp(CH$_2$)$_3$NMe$_2$], In[Cp(CH$_2$)$_2$NMe$_2$], In[CpCH$_2$NMe$_2$], In[CpCH$_2$CHMe-NMe$_2$], In[Cp(CHMe)NMe$_2$], In[CpNMe$_2$], In[CpNMeEt], In[CpNEt$_2$], In[CpNMeiPr], In[CpNiPr$_2$], In[Cp(CH$_2$)$_3$ PMe$_2$], In[Cp(CH$_2$)$_2$PMe$_2$], In[Cp(CHMe)PMe$_2$], In[CpCH$_2$PMe$_2$], In[CpPMe$_2$], In[CpPMeEt], In[CpPEt$_2$], In[CpPMeiPr], In[CpPiPr$_2$], In[Cp(CH$_2$)$_3$ BMe$_2$], In[Cp(CH$_2$)$_2$BMe$_2$], In[Cp(CHMe)BMe$_2$], In[CpCH$_2$BMe$_2$], In[CpBMe$_2$], In[CpB(OMe)$_2$], In[CpBMeEt], In[CpBEt$_2$], In[CpBMeiPr], In[CpBtPr$_2$], In[Cp(CH$_2$)$_3$OMe], In[Cp(CH$_2$)$_2$OMe], In[CpCH$_2$OMe], In[CpOMe], In[CpOEt], In[CpOiPr], In[Cp(CH$_2$)$_3$ SMe], In[Cp(CH$_2$)$_2$SMe], In[CpCH$_2$SMe], In[CpSMe], In[CpSEt], In[CpSIPr], or the like;
the heteroalkylcyclopentadienyl Indium(I) precursor being

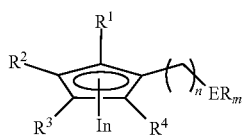

wherein n is 0 to 6 representing a $C_0$ to $C_6$ linear, cyclic or branched alkyl chain; E=Si, Ge, Sn, N, P, B, Al, Ga, In, O, S, Se, Te, F, Cl, Br, I; R=H, a $C_1$ to $C_5$ linear, branched or cyclic alkyl, or a heteroalkyl; m=0 to 4; $R^1$ to $R^4$ are each independently H, $C_1$-$C_4$ linear, branched or cyclic alkyls;
the heteroalkylcyclopentadienyl Indium(I) precursor being selected from In[CpMe$_4$(CH$_2$)$_3$NMe$_2$], In[CpMe$_4$(CH$_2$)$_2$NMe$_2$], In[CpMe$_4$CH$_2$CHMe-NMe$_2$], In[CpMe$_4$(CHMe)NMe$_2$], In[CpMe$_4$CH$_2$NMe$_2$], In[CpMe$_4$NMe$_2$], In[CpMe$_4$NMeEt], In[CpMe$_4$NEt$_2$], In[CpMe$_4$NMeiPr], In[CpMe$_4$NiPr$_2$], In[CpMe$_4$(CH$_2$)$_3$ PMe$_2$], In[CpMe$_4$(CH$_2$)$_2$PMe$_2$], In[CpMe$_4$(CHMe)PMe$_2$], In[CpMe$_4$CH$_2$PMe$_2$], In[CpMe$_4$PMe$_2$], In[CpMe$_4$PMeEt], In[CpMe$_4$PEt$_2$], In[CpMe$_4$PMeiPr], In[CpMe$_4$PiPr$_2$], In[CpMe$_4$(CH$_2$)$_3$ BMe$_2$], In[CpMe$_4$(CH$_2$)$_2$BMe$_2$], In[CpMe$_4$(CHMe)BMe$_2$], In[CpMe$_4$CH$_2$BMe$_2$], In[CpMe$_4$BMe$_2$], In[CpMe$_4$B(OMe)$_2$], In[CpMe$_4$BMeEt], In[CpMe$_4$BEt$_2$], In[CpMe$_4$BMeiPr], In[CpMe$_4$BiPr$_2$], In[CpMe$_4$(CH$_2$)$_3$OMe], In[CpMe$_4$(CH$_2$)$_2$OMe], In[CpMe$_4$CH$_2$OMe], In[CpMe$_4$OMe], In[CpMe$_4$OEt], In[CpMe$_4$OiPr], In[CpMe$_4$(CH$_2$)$_3$SMe], In[CpMe$_4$(CH$_2$)$_2$SMe], In[CpMe$_4$CH$_2$SMe], In[CpMe$_4$SMe], In[CpMe$_4$SEt], In[CpMe$_4$SiPr], or the like;
the heteroalkylcyclopentadienyl Indium(I) precursor being

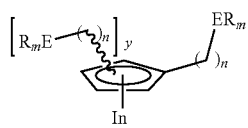

wherein n is 0 to 6 representing a $C_0$ to $C_6$ linear, cyclic or branched alkyl chain; E=Si, Ge, Sn, N, P, B, Al, Ga, In, O, S, Se, Te, F, Cl, Br, I; R=H, a $C_1$ to $C_5$ linear, branched or cyclic alkyl, or a heteroalkyl; m=0 to 4; y=1 to 4;
the heteroalkylcyclopentadienyl Indium(I) precursor being selected from In(Cp(NMe$_2$)$_2$), In(Cp(CH$_2$NMe$_2$)$_2$), In(Me$_3$Cp(NMe$_2$)$_2$), In(Me$_3$Cp(CH$_2$NMe$_2$)$_2$), In(iPr$_3$Cp(NMe$_2$)$_2$), In(iPr$_3$Cp(CH$_2$NMe$_2$)$_2$), or the like;
the heteroalkylcyclopentadienyl Indium(I) precursor being

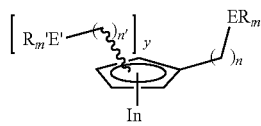

wherein n and n' are each independently 0 to 6, representing $C_0$ to $C_6$ linear, cyclic or branched alkyl chains; E and 'E' are each independently Si, Ge, Sn, N, P, B, Al, Ga, In, O, S, Se, Te, F, Cl, Br, I; R=H, a $C_1$ to $C_5$ linear, branched or cyclic alkyl, or a heteroalkyl; m=0 to 4; y=1 to 4;
the heteroalkylcyclopentadienyl Indium(I) precursor being selected from In(Cp(NMe$_2$)$_2$(NEt$_2$)), In(Cp(NEt$_2$)(CH$_2$NMe$_2$)$_2$), In(Me$_2$Cp(NMe$_2$)$_2$(NEt$_2$)), In(Me$_2$Cp(NEt$_2$)(CH$_2$NMe$_2$)$_2$), In(iPr$_2$Cp(NEt$_2$)(NMe$_2$)$_2$), In(iPr$_2$Cp(NEt$_2$)(CH$_2$NMe$_2$)$_2$), In(Cp(NMe$_2$)(BMe$_2$)), or the like;
the heteroalkylcyclopentadienyl Indium(I) precursor being In(Cp(CH$_2$)$_3$NMe$_2$);
the heteroalkylcyclopentadienyl Indium(I) precursor being In(CpPiPr$_2$);
further comprising the step of delivering into the reactor a co-reactant;
the co-reactant being an oxidizing agent selected from O$_2$, O$_3$, H$_2$O, H$_2$O$_2$, NO, N$_2$O, NO$_2$, O radicals, alcohol, silanols, aminoalcohols, carboxylic acids, para-formaldehyde, or mixtures thereof;
the co-reactant being O$_3$ or O$_2$;
the co-reactant being a nitrogen-containing reducing agent selected from NH$_3$, N$_2$, H$_2$, N$_2$H$_2$, H$_2$ and NH$_3$, N$_2$ and NH$_3$, NH$_3$ and N$_2$H$_4$, NO, N$_2$O, amines, diamines, cyanides, di-imines, hydrazines, organic amines, pyrazoline, pyridine, primary amines such as

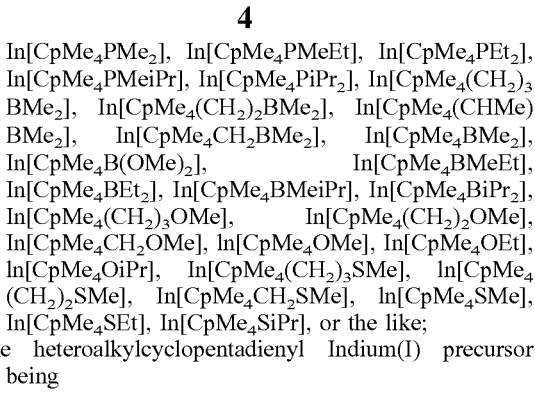

methylamine, ethylamine, tertbutylamine; secondary amines such as dimethylamine, diethylamine, di-isopropylamine, ethylmethylamine, pyrrolidine; tertiary amines such as trimethylamine, triethylamine, trisilylamine, or mixture thereof;

the co-reactant being $NH_3$;

the co-reactant being $N_2$ plasma;

$N_2$ plasma being an adequate co-reactant when the substrate temperature is lower than 250° C.;

the co-reactant being $H_2$, $H_2CO$, $N_2H_4$, $NH_3$, a primary amine, a secondary amine, a tertiary amine, trisilylamine, radicals thereof, and mixtures thereof for a conductive film;

the co-reactant being $H_2$;

the co-reactant being an oxidizing gas such as one of $O_2$, $O_3$, $H_2O$, $H_2O_2$, NO, $N_2O$, $NO_2$, oxygen containing radicals such as O— OH—, carboxylic acids, formic acid, acetic acid, propionic acid, and mixtures thereof for a dielectric film;

the oxidizing gas being selected from the group consisting of $O_3$, $H_2O_2$ $H_2O$;

the co-reactant being treated by a plasma;

the plasma source being a $N_2$ plasma, $N_2$/He plasma, $N_2$/Ar plasma, $NH_3$ plasma, $NH_3$/He plasma, $NH_2$/AR plasma, He plasma, Ar plasma, $H_2$ plasma, $H_2$/He plasma, $H_2$/organic amine plasma, and mixtures thereof;

the Indium-containing film being indium oxide, InSnO (ITO), InGaZnO (IGZO), InN, InP, InAs, InSb or $In_2S_3$;

the Indium-containing film containing a second element selected from P, N, S, Ga, As, B, Ta, Hf, Nb, Mg, Al, Sr, Y, Ba, Ca, As, Sb, Bi, Sn, Pb, Co, Zn, one or more lanthanides, or combinations thereof;

the Indium-containing film being a stack of alternating layers of $In_2O_3/ZrO_2$;

the Indium-containing film deposited by any of the disclosed processes having a bulk resistivity at room temperature of approximately 50 μohm·cm to approximately 1,000 μohm·cm;

substrate being a powder;

the powder comprising one or more of NMC (Lithium Nickel Manganese Cobalt Oxide), LCO (Lithium Cobalt Oxide), LFP (Lithium Iron Phosphate), and other battery cathode materials:

the deposition pressure being held between about $10^{-3}$ Torr and about 100 Torr;

the deposition pressure being held between about $10^{-2}$ Torr and 100 Torr;

the deposition temperature being held between about 100° C. and about 600° C.;

the deposition temperature being held between about 100° C. and about 500°; and the reactor wall being heated includes from approximately 50° C. to approximately 600° C.

A film forming composition for a vapor deposition process comprising a heteroalkylcyclopentadienyl indium(I) precursor having a general formula:

In[R¹R²R³R⁴CpL¹] or

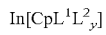
In[CpL¹L²_y]

wherein Cp represents a cyclopentadienyl ligand; $R^1$ to $R^4$ are each independently H, $C_1$-$C_4$ linear, branched or cyclic alkyls; $L^1$ and $L^2$ are each independently a substituent bonded to the Cp ligand and consisting of an alkyl chain containing at least one heteroatom, such as Si, Ge, Sn, N, P, B, Al, Ga, In, O, S, Se, Te, F, Cl, Br, I; and y=1-4. The disclosed film forming compositions may include one or more of the following aspects:

the film forming composition comprising between approximately 95% w/w and approximately 100.0% w/w of the precursor;

the purity of the film forming composition being greater than 95% w/w;

the purity of the film forming composition being greater than 98% w/w;

the purity of the film forming composition being greater than 99% w/w;

the film forming composition comprising between approximately 0.0% w/w and approximately 5.0% w/w impurities;

the film forming composition comprising between approximately 0.0% w/w and approximately 2.0% w/w impurities;

the film forming composition comprising between approximately 0.0% w/w and approximately 1.0% w/w impurities;

the metal impurity of the film forming composition being 0 ppbw to 1 ppmw; and the metal impurity of the film forming composition being 0 ppbw to 500 ppbw.

A film forming precursor being a heteroalkylcyclopentadienyl indium(I) precursor having a general formula:

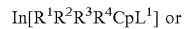
In[R¹R²R³R⁴CpL¹] or

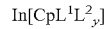
In[CpL¹L²_y]

wherein Cp represents a cyclopentadienyl ligand; $R^1$ to $R^4$ are each independently H, $C_1$-$C_4$ linear, branched or cyclic alkyls; $L^1$ and $L^2$ are each independently a substituent bonded to the Cp ligand and consisting of an alkyl chain containing at least one heteroatom, such as Si, Ge, Sn, N, P, B, Al, Ga, In, O, S, Se, Te, F, Cl, Br, I; and y=1-4. The disclosed film forming precursor may include one or more of the following aspects:

the purity of the film forming precursor being greater than 95% w/w;

the purity of the film forming precursor being greater than 98% w/w;

the purity of the film forming precursor being greater than 99% w/w;

the film forming precursor comprising between approximately 0.0% w/w and approximately 5.0% w/w impurities;

the film forming precursor comprising between approximately 0.0% w/w and approximately 2.0% w/w impurities;

the film forming precursor comprising between approximately 0.0% w/w and approximately 1.0% w/w impurities;

the metal impurity of the film forming precursor being 0 ppbw to 1 ppmw; and the metal impurity of the film forming precursor being 0 ppbw to 500 ppbw.

Notation and Nomenclature

The following detailed description and claims utilize a number of abbreviations, symbols, and terms, which are generally well known in the art.

As used herein, the indefinite article "a" or "an" means one or more.

As used herein, "about" or "around" or "approximately" in the text or in a claim means±10% of the value stated.

As used herein, "room temperature" in the text or in a claim means from approximately 20° C. to approximately 28° C.

The term "ambient temperature" refers to an environment temperature approximately 20° C. to approximately 28° C.

As used in the disclosed embodiments, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The substrate can be any solid that has functional groups on its surface that are prone to react with the reactive head of a SAM, and may include without limitation 3D objects or powders. Exemplary powder substrates include a powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

The terms "via", "aperture", "hole" and "trench" are sometimes used interchangeably, and generally mean an opening in an interlayer insulator.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements may be referred to by these abbreviation (e.g., Si refers to silicon, In refers to indium, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

The term "wafer" or "patterned wafer" refers to a wafer having a stack of silicon-containing films on a substrate and a patterned hardmask layer on the stack of silicon-containing films formed for pattern etch. The term "wafer" or "patterned wafer" may also refers to a trench wafer having an aspect ratio.

Note that herein, the terms "deposition temperature" and "substrate temperature" may be used interchangeably. It is understood that a substrate temperature may correspond to, or related to a deposition temperature, and that the deposition temperature may refer to the substrate temperature.

Note that herein, the terms "precursor", "precursor compound", "deposition compound" and "deposition gas" may be used interchangeably when the precursor is in a gaseous state at room temperature and ambient pressure. It is understood that a precursor may correspond to, or related to a deposition compound or deposition gas, and that the deposition compound or deposition gas may refer to the precursor.

As used in the disclosed embodiments, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used in the disclosed embodiments, the abbreviation "Me" refers to a methyl group; the abbreviation "Et" refers to an ethyl group; the abbreviation "Pr" refers to a propyl group; Cp refers to a cyclopentadienyl ligand; etc.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

DESCRIPTION OF PREFERRED EMBODIMENTS

Disclosed are indium (In)-containing film forming compositions comprising Indium (I) precursors, in particular, heteroalkylcyclopentadienyl indium precursors, methods of synthesizing them and methods of using them to deposit Indium-containing films by vapor deposition methods, such as atomic layer deposition (ALD) or chemical vapor deposition (CVD).

Since InCp* (In($C_5Me_5$)) slightly decomposes in the presence of donor solvents (See Beachley et al., Organometallics 1989, 8, 346-356), a heteroatom containing lone pair of electrons (such as N, O, S) on the ligand is added to the disclosed Indium (I) precursors that could promote the removal of the heteroalkyl Cp ligand during the deposition process. Generally, depending on the nature of the ligand to which is coordinated, Indium(I) may act as either a Lewis acid or a Lewis base because it has both vacant π orbitals and a lone pair of electrons. This amphiphilicity may offer specific reactivity by adding electron withdrawing or electron donating groups on the cyclopentadienyl ligand.

The disclosed In(I) precursors are the heteroalkylcyclopentadienyl indium precursors that contain a cyclopentadienyl ligand with heteroalkyl substituents, having general formula:

$$In[R^1R^2R^3R^4CpL^1] \quad \text{(I)}$$ or

$$In[CpL^1L^2{}_x] \quad \text{(II)}$$

wherein Cp represents a cyclopentadienyl ligand; $R^1$ to $R^4$ are each independently H, $C_1$-$C_4$ linear, branched or cyclic alkyls; $L^1$ and $L^2$ are each independently a substituent bonded to the Cp ligand and consisting of an alkyl chain having at least one heteroatom, such as Si, Ge, Sn, N, P, B, Al, Ga, In, O, S, Se, Te, F, Cl, Br, I; and x=1-4.

In one embodiment, $L^1$ and $L^2$ may be each independently a —($C_kH_l$-$ER_m$) group, wherein —$C_kH_l$ is a linear, cyclic or branched alkyl chain; k=0-6; l=0-11; E=Si, Ge, Sn, N, P, B, Al, Ga, In, O, S, Se, Te, F, Cl, Br, I; R is H, a $C_1$-$C_5$ linear, cyclic or branched alkyl; m=0-4.

The disclosed In (I) precursors shown in the formula (I) may include the following heteroalkylcyclopentadienyl In(I) precursors:

wherein n is 0 to 6 representing a $C_0$ to $C_6$ linear, cyclic or branched alkyl chain; E=N, P, B, O, S, F; R=H, a $C_1$ to $C_5$ linear, branched or cyclic alkyl, or a heteroalkyl; m=0 to 4; $R^1$ to $R^4$ are each H.

Exemplary In(I) precursors in formula (III) include In[Cp(CH$_2$)$_3$NMe$_2$], In[Cp(CH$_2$)$_2$NMe$_2$], In[CpCH$_2$NMe$_2$], In[CpCH$_2$CHMe-NMe$_2$], In[Cp(CHMe)NMe$_2$], In[CpNMe$_2$], In[CpNMeEt], In[CpNEt$_2$], In[CpNMetPr], In[CpNiPr$_2$], In[Cp(CH$_2$)$_3$PMe$_2$], In[Cp(CH$_2$)$_2$PMe$_2$], In[Cp(CHMe)PMe$_2$], In[CpCH$_2$PMe$_2$], In[CpPMe$_2$], In[CpPMeEt], In[CpPEt$_2$], In[CpPMeiPr], In[CpPiPr$_2$], In[Cp(CH$_2$)$_3$BMe$_2$], In[Cp(CH$_2$)$_2$BMe$_2$], In[Cp(CHMe)BMe$_2$], In[CpCH$_2$BMe$_2$], In[CpBMe$_2$], In[CpB(OMe)$_2$], In[CpBMeEt], In[CpBEt$_2$], In[CpBMeiPr], In[CpBrPr$_2$], In[Cp(CH$_2$)$_3$OMe], In[Cp(CH$_2$)$_2$OMe], In[CpCH$_2$OMe], In[CpOMe], In[CpOEt], In[CpOtPr], In[Cp(CH$_2$)$_3$ SMe], In[Cp(CH$_2$)$_2$SMe], In[CpCH$_2$SMe], In[CpSMe], In[CpSEt], In[CpSiPr], etc.

Alternatively, the disclosed In(I) precursors shown in the formula (I) may include the following heteroalkylcyclopentadienyl In(I) precursors:

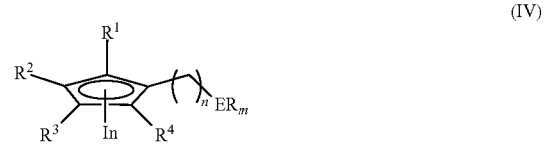

wherein n is 0 to 6 representing a $C_0$ to $C_6$ linear, cyclic or branched alkyl chain; E=Si, Ge, Sn, N, P, B, Al, Ga, In, O, S, Se, Te, F, Cl, Br, I; R=H, a $C_1$ to $C_5$ linear, branched or cyclic alkyl, or a heteroalkyl; m=0 to 4; $R^1$ to $R^4$ are each independently H, $C_1$-$C_4$ linear, branched or cyclic alkyls.

Exemplary In(I) precursors in formula (IV) include In[CpMe$_4$(CH$_2$)$_3$NMe$_2$], In[CpMe$_4$(CH$_2$)$_2$NMe$_2$], In[CpMe$_4$CH$_2$CHMe-NMe$_2$], In[CpMe$_4$(CHMe)NMe$_2$], In[CpMe$_4$CH$_2$NMe$_2$], In[CpMe$_4$NMe$_2$], In[CpMe$_4$NMeEt], In[CpMe$_4$NEt$_2$], In[CpMe$_4$NMeiPr], In[CpMe$_4$NiPr$_2$], In[CpMe$_4$(CH$_2$)$_3$PMe$_2$], In[CpMe$_4$(CH$_2$)$_2$PMe$_2$], In[CpMe$_4$(CHMe)PMe$_2$], In[CpMe$_4$CH$_2$PMe$_2$], In[CpMe$_4$PMe$_2$], In[CpMe$_4$PMeEt], In[CpMe$_4$PEt$_2$], In[CpMe$_4$PMeiPr], In[CpMe$_4$PiPr$_2$], In[CpMe$_4$(CH$_2$)$_3$BMe$_2$], In[CpMe$_4$(CH$_2$)$_2$BMe$_2$], In[CpMe$_4$(CHMe)BMe$_2$], In[CpMe$_4$CH$_2$BMe$_2$], In[CpMe$_4$BMe$_2$], In[CpMe$_4$B(OMe)$_2$], In[CpMe$_4$BMeEt], In[CpMe$_4$BEt$_2$], In[CpMe$_4$BMeiPr], In[CpMe$_4$BiPr$_2$], In[CpMe$_4$(CH$_2$)$_3$OMe], In[CpMe$_4$(CH$_2$)$_2$OMe], In[CpMe$_4$CH$_2$OMe], In[CpMe$_4$OMe], In[CpMe$_4$OEt], In[CpMe$_4$OiPr], In[CpMe$_4$(CH$_2$)$_3$SMe], In[CpMe$_4$(CH$_2$)$_2$SMe], In[CpMe$_4$CH$_2$SMe], In[CpMe$_4$SMe], In[CpMe$_4$SEt], In[CpMe$_4$SiPr], etc.

Alternatively, the disclosed In(I) precursors shown in the formula (II) may include the following heteroalkylcyclopentadienyl In(I) precursors, wherein $L^1$ and $L^2$ are the same substituents bonded to the cyclopentadienyl:

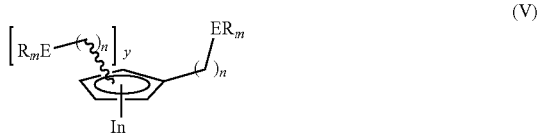

(V)

wherein n is 0 to 6 representing a $C_0$ to $C_6$ linear, cyclic or branched alkyl chain; E=Si, Ge, Sn, N, P, B, Al, Ga, In, O, S, Se, Te, F, Cl, Br, I; R=H, a $C_1$ to $C_5$ linear, branched or cyclic alkyl, or a heteroalkyl; m=0 to 4; y=1 to 4.

Exemplary In(I) precursors shown in (V) include In(Cp(NMe$_2$)$_2$), In(Cp(CH$_2$NMe$_2$)$_2$), In(Me$_3$Cp(NMe$_2$)$_2$), In(Me$_3$Cp(CH$_2$NMe$_2$)$_2$), In(iPr$_3$Cp(NMe$_2$)$_2$), In(iPr$_3$Cp(CH$_2$NMe$_2$)$_2$), etc.

Alternatively, the disclosed In(I) precursors shown in the formula (II) may include the following heteroalkylcyclopentadienyl In(I) precursors, wherein L$^1$ and L$^2$ are the different substituents bonded to the cyclopentadienyl:

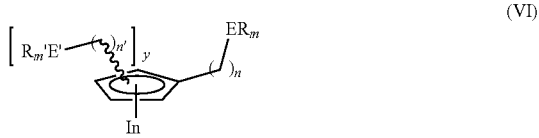

(VI)

wherein n and n' are each independently 0 to 6, representing $C_0$ to $C_6$ linear, cyclic or branched alkyl chains; E and 'E' are each independently Si, Ge, Sn, N, P, B, Al, Ga, In, O, S, Se, Te, F, Cl, Br, I; R=H, a $C_1$ to $C_5$ linear, branched or cyclic alkyl, or a heteroalkyl; m=0 to 4; y=1 to 4.

Exemplary In(I) precursors shown in (VI) include In(Cp(NMe$_2$)$_2$(NEt$_2$)), In(Cp(NEt$_2$)(CH$_2$NMe$_2$)$_2$), In(Me$_2$Cp(NMe$_2$)$_2$(NEt$_2$)), In(Me$_2$Cp(NEt$_2$)(CH$_2$NMe$_2$)$_2$), In(iPr$_2$Cp(NEt$_2$)(NMe$_2$)$_2$), In(iPr$_2$Cp(NEt$_2$)(CH$_2$NMe$_2$)$_2$), In(Cp(NMe$_2$)(BMe$_2$)), etc.

The disclosed In(I) precursors and the disclosed film forming compositions are suitable to deposit the corresponding element-containing films and its related use for deposition of the corresponding element-containing layers.

The disclosed In(I) precursors and the disclosed film forming compositions are suitable for forming indium-containing thin films, such as indium oxide, InSnO (ITO), InGaZnO (IGZO), InN, InP, InAs, InSb, In$_2$S$_3$, used in electronic fields. The disclosed In(I) precursors and the disclosed film forming compositions are useful for the fabrications of indium tin oxide (Indium Gallium Zinc Oxide (IGZO)) in displays, solar fuel, high speed electronic (InN), optoelectronic components, high-speed electronics, photovoltaics (InP), infrared detectors, diode laser (InAs), fast transistors, magnetic field, thermal image detectors (InSb), photoelectronic devices, photoelectrochemical water splitting (In$_2$S$_3$), LED applications, the fabrication of copper indium gallium selenide (CIGS) in photovoltaics and optical applications, logic and memories industries, semiconductors, and the like.

Also disclosed are processes for forming an Indium-containing film and methods for forming an oxygenated or oxygen-free Indium-containing film using the disclosed In(I) precursors by ALD, CVD or other deposition methods. The disclosed processes are deposition processes where the disclosed In(I) precursors are used and introduced into a reaction chamber for deposition a film in ALD, CVD, spin-on, spray, dip coating, slit coating or any other deposition technique to form a film, in combination with or without one or more oxidants (for example O$_2$ and O$_3$, or H$_2$O and O$_3$), or with one or more reductants or nitriding agents (for example H$_2$ and NH$_3$, N$_2$ and NH$_3$, or NH$_3$ and N$_2$H$_4$) introduced simultaneously and/or sequentially into the reactor. The disclosed deposition processes using the disclosed In(I) precursors may be assisted by heating, light, direct or remote plasma, or combination thereof.

More specifically, in addition to the disclosed In(I) precursors, a reactant or a co-reactant may also be introduced into the reaction chamber. The co-reactant may be an oxygen-containing gas or an oxidant or an oxidizer. The oxygen-containing gas includes, but is not limited to, oxidizers such as, O$_2$, O$_3$, H$_2$O, H$_2$O$_2$, NO, N$_2$O, NO$_2$, O radicals, alcohol, silanols, aminoalcohols, carboxylic acids, para-formaldehyde, and combinations thereof. Preferably the oxygen-containing gas is O$_3$ or O$_2$. Alternatively, the co-reactant may be a nitrogen-containing gas or a reducing gas or a reductant. The nitrogen-containing gas includes, but is not limited to, NH$_3$, N$_2$, H$_2$, N$_2$/H$_2$, H$_2$ and NH$_3$, N$_2$ and NH$_3$, NH$_3$ and N$_2$H$_4$, NO, N$_2$O, amines, diamines, cyanides, di-imines, hydrazines, organic amines, pyrazoline, pyridine, primary amines such as methylamine, ethylamine, tert-butylamine; secondary amines such as dimethylamine, diethylamine, di-isopropylamine, ethylmethylamine, pyrrolidine; tertiary amines such as trimethylamine, triethylamine, trisilylamine, or mixture thereof, preferably NH$_3$. The co-reactant may be activated by a plasma, either in-situ or remotely. For N$_2$ or N$_2$/H$_2$, the plasma activation is required. The co-reactant may be selected from NH$_3$, NO, N$_2$O, hydrazines, N$_2$ plasma, N$_2$/H$_2$ plasma, amines and combinations thereof. Applicants discovered that N$_2$ plasma may be an adequate co-reactant when the substrate temperature is lower than 250° C.

When the target is a conductive film, the co-reactant may be H$_2$, H$_2$CO, N$_2$H$_4$, NH$_3$, a primary amine, a secondary amine, a tertiary amine, trisilylamine, radicals thereof, and mixtures thereof. Preferably, the co-reactant is H$_2$ or NH$_3$. Alternatively, when the target is a dielectric film, the co-reactant may be an oxidizing gas such as one of O$_2$, O$_3$, H$_2$O, H$_2$O$_2$, NO, N$_2$O, NO$_2$, oxygen containing radicals such as O— OH—, carboxylic acids, formic acid, acetic acid, propionic acid, and mixtures thereof. Preferably, the oxidizing gas is selected from the group consisting of O$_3$, H$_2$O$_2$ H$_2$O.

Furthermore, the co-reactant may be treated by a plasma, in order to decompose the reactant into its radical form, at least one of H$_2$, N$_2$ and O$_2$ may be utilized as a hydrogen, nitrogen or oxygen source gas, respectively, when treated with plasma. The plasma source may be a N$_2$ plasma, N$_2$/He plasma, N$_2$/Ar plasma, NH$_3$ plasma, NH$_3$/He plasma, NH$_2$/AR plasma, He plasma, Ar plasma, H$_2$ plasma, H$_2$/He plasma, H$_2$/organic amine plasma, and mixtures thereof. For instance, the plasma may be generated with a power ranging from about 10 W to about 1000 W, preferably from about 50 W to about 500 W. The plasma may be generated present within the reactor itself. Alternatively, the plasma may generally be at a location removed from the reactor, for instance, in a remotely located plasma system. One of skill in the art will recognize methods and apparatus suitable for such plasma treatment.

For example, the co-reactant may be introduced into a direct plasma reactor, which generates plasma in the reaction chamber, to produce the plasma-treated reactant in the reaction chamber. Exemplary direct plasma reactors include the Titan™ PECVD System produced by Trion Technologies. The co-reactant may be introduced and held in the reaction chamber prior to plasma processing. Alternatively, the plasma processing may occur simultaneously with the introduction of the reactant. In-situ plasma is typically a 13.56 MHz RF inductively coupled plasma that is generated between the showerhead and the substrate holder. The substrate and the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the co-reactant using in-situ plasma is typically less than achieved using a remote plasma source for the same power input and is therefore not as efficient in reactant dissociation as a remote plasma system, which may be beneficial for the deposition of films on substrates easily damaged by plasma.

Alternatively, the plasma-treated co-reactant may be produced outside of the reaction chamber, for example, a remote plasma to treat the co-reactant prior to passage into the reaction chamber.

Also disclosed are methods for forming indium(I)-containing layers on a substrate using a vapor deposition process. Applicants believe that the disclosed film forming compositions are suitable for ALD. More particularly, the disclosed film forming compositions are capable of surface saturation, self-limited growth per cycle, and perfect step coverage on aspects ratios ranging from approximately 2:1 to approximately 200:1, and preferably from approximately 20:1 to approximately 100:1. Additionally, the disclosed film forming compositions have high decomposition temperatures, indicating good thermal stability to enable ALD. The high decomposition temperatures permit ALD at higher temperatures (e.g., approximately 600° C.), resulting in films having higher purity. The disclosed methods may be useful in the manufacture of semiconductor, photovoltaic, LCD-TFT, flat panel type devices.

The disclosed film forming compositions may be used to deposit films using any deposition methods known to those of skill in the art. Examples of suitable vapor deposition methods include CVD and ALD. Exemplary CVD methods include thermal CVD, plasma enhanced CVD (PECVD), pulsed CVD (PCVD), low pressure CVD (LPCVD), sub-atmospheric CVD (SACVD) atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial ALD, hot-wire ALD (HWALD), radicals incorporated ALD, and combinations thereof, Super critical fluid deposition may also be used. The deposition method is preferably ALD, PE-ALD, spatial ALD in order to provide suitable step coverage and film thickness control, Purity of the disclosed film forming composition is greater than 95% w/w (i.e., 95.0% w/w to 100.0% w/w), preferably greater than 98% w/w (i.e., 98.0% w/w to 100.0% w/w), and more preferably greater than 99% w/w (i.e., 99.0% w/w to 100.0% w/w). One of ordinary skill in the art will recognize that the purity may be determined by H NMR and gas liquid chromatography with mass spectrometry. The disclosed film forming compositions may contain any of the following impurities: pyrazoles; pyridines; alkylamines; alkylimines; THF; ether; pentane; cyclohexane; heptanes; benzene; toluene; chlorinated metal compounds; lithium, sodium, potassium pyrazolyl. The total quantity of these impurities is preferably below 5% w/w (i.e., 0.0% w/w to 5.0% w/w), preferably below 2% w/w (i.e., 0.0% w/w to 2.0% w/w), and more preferably below 1% w/w (i.e., 0.0% w/w to 1.0% w/w). The disclosed film forming composition may be purified by recrystallisation, sublimation, distillation, and/or passing the gas liquid through a suitable adsorbent, such as a 4 Å molecular sieve.

Purification of the disclosed film forming composition may also result in metal impurities at the 0 ppbw to 1 ppmw, preferably 0-500 ppbw (part per billion weight) level. These metal impurities may include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), and Zinc (Zn).

The disclosed film forming compositions may be supplied either in neat form or in a blend with a suitable solvent, such as ethyl benzene, xylene, mesitylene, decalin, decane, dodecane. The disclosed precursors may be present in varying concentrations in the solvent.

The neat blended film forming compositions are introduced into a reactor in a vapor form by conventional means, such as tubing and/or flow meters. The vapor form may be produced by vaporizing the neat or blended composition through a conventional vaporization step such as direct vaporization, distillation, by bubbling, or by using a sublimator. The neat or blended composition may be fed in liquid state to a vaporizer where it is vaporized before it is introduced into the reactor. Alternatively, the neat or blended composition may be vaporized by passing a carrier gas into a container containing the composition by bubbling the carrier gas into the composition. The carrier gas may include, but is not limited to, Ar, He, $N_2$, and mixtures thereof. Bubbling with a carrier gas may also remove any dissolved oxygen present in the neat or blended composition. The carrier gas and composition are then introduced into the reactor as a vapor, If necessary, the container containing the disclosed film forming composition may be heated to a temperature that permits the composition to be in its liquid phase and to have a sufficient vapor pressure. The container may be maintained at temperatures in the range of, for example, approximately 0° C. to approximately 200° C. Those skilled in the art recognize that the temperature of the container may be adjusted in a known manner to control the amount of precursor vaporized.

The reactor may be any enclosure chamber within a device in which deposition methods take place such as without limitation, a parallel-plate type reactor, a cold-wall type reactor, a hot-wall type reactor, a single-wafer reactor, a multi-wafer reactor, other types of deposition systems under conditions suitable to cause the compounds to react and form the layers. One of ordinary skill in the art will recognize that any of these reactors may be used for either ALD or CVD deposition processes.

The reactor contains one more substrates onto which the films will be deposited. A substrate is generally defined as the material on which a process is conducted. The substrates may be any suitable substrate used in semiconductor, photovoltaic, flat panel, LCD-TFT device manufacturing. Examples of suitable substrates include wafers, such as silicon, silica, glass, GaAs wafers. The wafer may have one more layers of differing materials deposited on it from a previous manufacturing step. For example, the wafers may include a dielectric layer. Furthermore, the wafers may include silicon layers (crystalline, amorphous, porous, etc), silicon oxide layers, silicon nitride layers, silicon oxy nitride layers, carbon doped silicon oxide (SiCOH) layers, metal, metal oxide metal nitride layers (Ti, Ru, Ta, etc), and combinations thereof. Additionally, the wafers may include copper layers, noble metal layers (e.g., platinum, palladium, rhodium, gold). The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. The disclosed processes may deposit the layer directly on the wafer or directly on one or more layers on top of the wafer when patterned layers are formed on the substrate. The patterned layers may be alternating layers of two specific layers such as $In_2O_3$ and $ZrO_2$ used in 3D NAND. Furthermore, one of ordinary skill in the art will recognize that the terms "film" "layer" used herein refer to a thickness of some material laid on spread over a surface and that the surface may be a trench a line. Throughout the specification and claims, the wafer and any associated layers thereon are referred to as substrates. For example, an Indium oxide film may be deposited onto a metal oxide layer, such as a $ZrO_2$ layer, an $HfO_2$ layer, a $MoO_2$ layer.

The substrate final application is not limited to the present invention, but this technology may find particular benefits for the following types of substrates: silicon wafers, glass wafers and panels, beads, powders and nano-powders, monolithic porous media, printed circuit board, plastic sheets, etc. Exemplary powder substrates include a powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

The temperature and the pressure within the reactor are held at conditions suitable for vapor depositions, such as ALD and CVD. In other words, after introduction of the vaporized disclosed film forming composition into the chamber, conditions within the chamber are at least part of the precursor is deposited onto the substrate to form a layer. For instance, the pressure in the reactor or the deposition pressure may be held between about $10^3$ Torr and about 100 Torr, more preferably between about $10^{-2}$ Torr and about 100 Torr, as required per the deposition parameters. Likewise, the temperature in the reactor or the deposition temperature may be held between about 100° C. and about 600° C., preferably between about 100° C. and about 500° C. One of ordinary skill in the art will recognize that "at least part of the precursor is deposited" means that some or all of the precursor reacts with or adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 50° C. to approximately 600° C. When a plasma deposition process is utilized, the deposition temperature may range from approximately 100° C. to approximately 500° C. Alternatively, when a thermal process is performed, the deposition temperature may range from approximately 100° C. to approximately 600° C.

ALD conditions within the chamber allow the disclosed film forming composition adsorbed or chemisorbed on the substrate surface to react and form a film on the substrate. In some embodiments, Applicants believe that plasma-treating the co-reactant may provide the co-reactant with the energy needed to react with the disclosed film forming composition. When the co-reactant in this exemplary ALD process is treated with a plasma, the exemplary ALD process becomes an exemplary PEALD process. The co-reactant may be treated with plasma prior subsequent to introduction into the chamber.

The film forming composition and co-reactants may be introduced into the reactor sequentially (ALD). The reactor may be purged with an inert gas between the introduction of each of the film forming composition, any additional precursors, and the co-reactants. Another example is to introduce the co-reactant continuously and to introduce the film forming composition by pulse, while activating the co-reactant sequentially with a plasma, provided that the film forming composition and the non-activated co-reactant do not substantially react at the chamber temperature and pressure conditions (CW PEALD).

Each pulse of the disclosed film forming composition may last for a time period ranging from about 0.01 seconds to about 120 seconds, alternatively from about 1 seconds to about 80 seconds, alternatively from about 5 seconds to about 30 seconds. The co-reactant may also be pulsed into the reactor, In such embodiments, the pulse of each may last for a time period ranging from about 0.01 seconds to about 120 seconds, alternatively from about 1 seconds to about 30 seconds, alternatively from about 2 seconds to about 20 seconds. In another alternative, the vaporized film forming compositions and co-reactants may be simultaneously sprayed from different sectors of a shower head (without mixing of the composition and the reactant) under which a susceptor holding several wafers is spun (spatial ALD).

Depending on the particular process parameters, deposition may take place for a varying length of time. Generally, deposition may be allowed to continue as long as desired necessary to produce a film with the necessary properties. Typical film thicknesses may vary from several angstroms to several hundreds of microns, and typically from 2 to 100 nm, depending on the specific deposition process. The deposition process may also be performed as many times as necessary to obtain the desired film.

The disclosed film forming compositions and co-reactants may be introduced into the reactor either simultaneously (CVD), sequentially (ALD) or different combinations thereof. The reactor may be purged with an inert gas (for example, $N_2$, Ar, Kr, Xe) between the introduction of the film forming composition and the introduction of the co-reactant. Alternatively, the co-reactant and the film forming composition may be mixed together to form a co-reactant/compound mixture, and then introduced to the reactor in a mixture form. Another example is to introduce the co-reactant continuously and to introduce the disclosed film forming composition by pulse (pulsed CVD).

In a non-limiting exemplary ALD process of forming an indium-containing film, the vapor phase of the disclosed film forming composition, such as, $In(CpPiPr_2)$, is introduced into the reactor, where it is contacted with a suitable substrate. Excess composition may then be removed from the reactor by purging and/or evacuating the reactor, that is, either by purging a reactor with an inert gas (for example, $N_2$, Ar, Kr, Xe), or passing the substrate in a sector under high vacuum and/or a carrier gas curtain. A co-reactant (for example, $O_3$) is introduced into the reactor where it reacts with the adsorbed film forming composition in a self-limiting manner. Any excess co-reactant is removed from the reactor by purging and/or evacuating the reactor. If the desired film is an oxide, such as $In_2O_3$, this two-step process may provide the desired film thickness may be repeated until a film having the necessary thickness has been obtained. By alternating the provision of the indium film forming composition and co-reactant, a film of desired composition and thickness can be deposited.

Alternatively, if the desired film contains indium and a second element, the two-step process above may be followed by introduction of the vapor of an additional precursor compound that contains the second element into the reactor (three-step process). The additional precursor compound will be selected based on the nature of the film being deposited. The second elements may include P, N, S, Ga, As, B, Ta, Hf, Nb, Mg, Al, Sr, Y, Ba, Ca, As, Sb, Bi, Sn, Pb, Co, Zn, one or more lanthanides, or combinations thereof. When an additional precursor compound is utilized, the resultant film deposited on the substrate contains indium in combination with an additional element. When the additional precursor and the In(I) precursor are used in more than one ALD super cycle sequences, a nanolaminate film is obtained. After introduction into the reactor, the additional precursor compound is contacted or adsorbed with the substrate. Afterward, any excess additional precursor compound is removed from the reactor by purging and/or evacuating the reactor. Once again, a co-reactant may be introduced into the reactor to react with the indium precursor compound. Excess co-reactant is removed from the reactor by purging and/or evacuating the reactor. If a desired film thickness has been achieved, the process may be terminated. However, if a thicker film is desired, the entire three-step process may be repeated. By alternating the provision of the indium film forming composition, additional precursor compound, and co-reactant, a film of desired composition and thickness can be deposited.

Alternatively, in a non-limiting exemplary ALD process of forming a stack of alternating layers, the vapor phase of one of the disclosed film forming composition, such as, $In(CpPiPr_2)$, is introduced into the reactor, where it is contacted or adsorbed with a substrate forming an adsorbed film. Excess composition may then be removed from the reactor by purging with an inert gas and/or evacuating the reactor. Afterward, a co-reactant (for example, $O_3$) is introduced into the reactor where it reacts with the absorbed film forming composition in a self-limiting manner to form an oxide film such as $In_2O_3$. Then any excess $O_3$ gas is removed from the reactor by purging with an inert gas and/or evacuating the reactor. These two steps may be repeated until the oxide film $In_2O_3$ obtains a desired thickness, typically around 10 angstroms. Next, another layer such as $ZrO_2$ may be deposited on the oxide film $In_2O_3$, For example, $ZrCp(NMe_2)_3$ may serve as the Zr precursor. A co-reactant may be used for forming the layer of $ZrO_2$ on top of $In_2O_3$. The non-limiting exemplary ALD process described above using $In(CpPiPr_2)$ and $O_3$ may then be repeated on the $ZrO_2$ layer. The entire four-step process (e.g., indium precursor/O-containing co-reactant/a second precursor/O-containing co-reactant) may be repeated, thereby forming a stack of alternating layers of $In_2O_3/ZrO_2$. By alternating the provision of the indium film forming composition, the co-reactant, additional precursor compound, and the co-reactant, a film of desired composition and thickness can be deposited. The resulting $In_2O_3/ZrO_2$ stack may be used in DRAM capacitors.

The indium-containing films resulting from the processes discussed above may include indium oxide, InSnO (ITO), InGaZnO (IGZO), InN, InP, InAs, InSb, $In_2S_3$. One of ordinary skill in the art will recognize that by appropriate selection of the film forming composition and co-reactants, the desired film composition may be obtained. The indium-containing films may provide suitable step coverage for capacitor electrodes in DRAM, the gate metal in 3D flash memory devices, the heating element in phase change memory, the electromigration barrier layer, gate metal, and contact layers in logic devices.

Upon obtaining a desired film thickness, the film may be subject to further processing, such as thermal annealing, furnace-annealing, rapid thermal annealing, UV e-beam curing, and/or plasma gas exposure. Those skilled in the art recognize the systems and methods utilized to perform these additional processing steps. For example, the $In_2O_3$ film may be exposed to a temperature ranging from approximately 200° C. and approximately 1000° C. for a time ranging from approximately 0.1 second to approximately 7200 seconds under an inert atmosphere or an O-containing atmosphere, combinations thereof. Most preferably, the temperature is 400° C. for 3600 seconds under an inert atmosphere or an O-containing atmosphere. The resulting film may contain fewer impurities and therefore may have an improved density resulting in improved leakage current. The annealing step may be performed in the same reaction chamber in which the deposition process is performed, or performed in a separate apparatus. Any of the above post-treatment methods, but especially thermal annealing, has been found effective to reduce carbon and nitrogen contamination of the $In_2O_3$ film. This in turn tends to improve the resistivity of the film.

After annealing, the indium-containing films deposited by any of the disclosed processes may have a bulk resistivity at room temperature of approximately 50 µohm·cm to approximately 1,000 µohm·cm. Room temperature is approximately 20° C. to approximately 28° C. depending on the season. Bulk resistivity is also known as volume resistivity. One of ordinary skill in the art will recognize that the bulk resistivity is measured at room temperature on the films that are typically approximately 50 nm thick. The bulk resistivity typically increases for thinner films due to changes in the electron transport mechanism. The bulk resistivity also increases at higher temperatures.

EXAMPLES

The following non-limiting examples are provided to further illustrate embodiments of the invention. However, the examples are not intended to be all inclusive and are not intended to limit the scope of the inventions described herein.

Example 1: Synthesis of $In(Cp(CH_2)_3NMe_2)$

InCl (1 eq.) was added to a Schlenk flask charged with $LiCp(CH_2)_3NMe_2$ (11 mmol) in $Et_2O$ (50 mL). The reaction mixture was stirred overnight at room temperature. After filtration of the reaction mixture, the solvent was evaporated under reduced pressure to obtain a red oil. After distillation a yellow liquid final product was collected (mp~5° C.). Various measurements were done to the final product. $^1H$ NMR ($C_6D_6$, 400 MHz): δ 5.94 (t, 2H, Cp-H), 5.82 (t, 2H, Cp-H), 2.52 (t, 2H, N—$CH_2$—), 2.21 (t, 2H, Cp-$CH_2$—), 2.09 (s, 6H, $N(CH_3)_2$), 1.68 (q, 2H, C—$CH_2$—C). Thermogravimetric (TG) measurement was carried out under the following measurement conditions: sample weight: 22.35 mg, atmosphere: $N_2$ at 1 atm, and rate of temperature increase: 10.0° C./min. 97.2% of the compound mass had evaporated up to 250° C. (Residue <2.8%). T (50%)=208° C. Vacuum TG measurement was carried out under delivery conditions, under the following measurement conditions: sample weight: 5.46 mg, atmosphere: $N_2$ at 20 mbar, and rate of temperature increase: 10.0° C./min. TG measurement was carried out under delivery conditions into the reactor (about 20 mbar). 50% of the sample mass is evaporated at 111° C.

Example 2: Synthesis of $In(CpPiPr_2)$

Same procedure as Example 1 started from $Li(CpPiPr_2)$ was performed to synthesize $In(CpPiPr_2)$. An orange liquid was obtained. $^1H$ NMR ($C_6D_6$, 400 MHz): δ 6.17 (t, 2H, Cp-H), 5.99 (t, 2H, Cp-H), 1.91 (sept, 2H, P—CH—), 1.20-1.00 (m, 12H, C—$CH_3$).

Prophetic Example 1: Deposition Using $In(Cp(CH_2)_3NMe_2)$

Using $In(Cp(CH_2)_3NMe_2)$ synthesized in Example 1 as an indium precursor and $H_2O$ and $O_3$ as reaction gases, indium oxide film may be formed on a substrate by ALD method under the following deposition conditions. First step, a cylinder filled with $In(Cp(CH_2)_3NMe_2)$ is heated to 90° C., bubbled with 100 sccm of $N_2$ gas and the $In(Cp(CH_2)_3NMe_2)$ is introduced into a reaction chamber (pulse A). Next step, $O_3$ generated by an ozone generator is supplied with 50 sccm of $N_2$ gas and introduced into the reaction chamber (pulse B). Following each step, a 4 second purge step using 200 sccm of $N_2$ as a purge gas was performed to the reaction chamber. 200 cycles were performed on a Si substrate having a substrate temperature of 150° C. in the reaction chamber at a pressure of about 1 torr. As a result, an indium oxide film will be obtained at approximately 150° C.

Prophetic Example 2: Deposition Using $In(CpPiPr_2)$

Using $In(CpPiPr_2)$ synthesized in Example 2 as the indium precursor and $H_2O$ and $O_3$ as the reaction gases, indium oxide film may be formed on a substrate by the ALD method under the following deposition conditions. First step, a cylinder filled with $In(CpPiPr_2)$ is heated to 90° C., bubbled with 100 sccm of $N_2$ gas and the $In(CpPiPr_2)$ is introduced into a reaction chamber (pulse A). Next step, $O_3$ generated by an ozone generator is supplied with 50 sccm of $N_2$ gas and introduced into the reaction chamber (pulse B). Following each step, a 4 second purge step using 200 sccm of $N_2$ as a purge gas was performed to the reaction chamber. 200 cycles were performed on the Si substrate having a substrate temperature of 150° C. in an ALD chamber at a pressure of about 1 torr. As a result, an indium oxide was obtained at 150° C.

Prophetic Example 3: Synthesis of $In(CpNMe_2)$ and Deposition Using $In(CpNMe_2)$ InCl (1 eq.) was added to a schlenk flask charged with $LiCpNMe_2$ in $Et_2O$ (50 mL). The reaction mixture was stirred overnight at room temperature. After filtration of the reaction mixture, the solvent was evaporated under reduced pressure to obtain the target compound.

Using synthesized $In(CpNMe_2)$ in combination of $H_2O$ and/or $O_3$ as the reaction gas, an indium oxide film may be formed on a substrate by the ALD method under the following deposition conditions. First step, a cylinder filled with $LiCpNMe_2$ is heated to 90° C., bubbled with 100 sccm of $N_2$ gas and the $LiCpNMe_2$ is introduced into a reaction chamber (pulse A). Next step, $O_3$ generated by an ozone generator is supplied with 50 sccm of $N_2$ gas and introduced into the reaction chamber (pulse B). Following each step, a 4 second purge step using 200 sccm of $N_2$ as a purge gas was performed to the reaction chamber. 200 cycles were performed on the Si substrate having a substrate temperature of 150° C. in an ALD chamber at a pressure of about 1 torr. As a result, an indium oxide was obtained at 150° C.

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for forming an Indium-containing film, the method comprising the steps of:
exposing a substrate to a vapor of a film forming composition; wherein the film forming composition comprises a heteroalkylcyclopentadienyl Indium (I) precursor having a general formula:

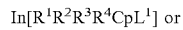

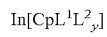

wherein Cp represents a cyclopentadienyl ligand; $R^1$ to $R^4$ are each independently H, $C_1$-$C_4$ linear, branched or cyclic alkyls; $L^1$ and $L^2$ are each independently a substituent bonded to the Cp ligand and consisting of an alkyl chain containing at least one heteroatom selected from Si, Ge, Sn, N, P, B, Al, Ga, In, O, S, Se, Te, F, Cl, Br, I; and y=1-4; and
depositing at least part of the heteroalkylcyclopentadienyl Indium(I) precursor onto the substrate to form the Indium-containing film using a vapor deposition method.

2. The method of claim 1, wherein the vapor deposition method is ALD, CVD or a combination thereof.

3. The method of claim 1, wherein $L^1$ and $L^2$ are each independently a —($C_kH_l$-$ER_m$) group, wherein —$C_kH_l$ is a linear, cyclic or branched alkyl chain; k=0-6; l=0-11; E=Si, Ge, Sn, N, P, B, Al, Ga, In, O, S, Se, Te, F, Cl, Br, I; R is H, a $C_1$-$C_5$ linear, cyclic or branched alkyl.

4. The method of claim 1, wherein the heteroalkylcyclopentadienyl Indium(I) precursor is selected from the group consisting of

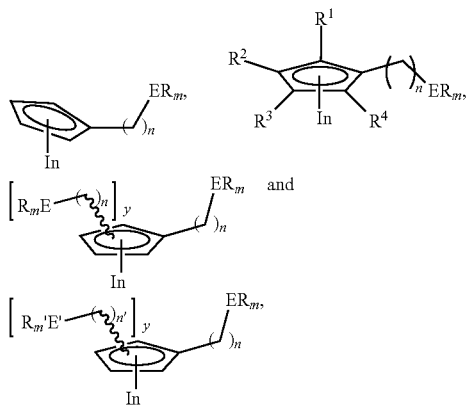

wherein n and n' are each independently 0 to 6, representing $C_0$ to $C_6$ linear, cyclic or branched alkyl chain; E and 'E' are each independently Si, Ge, Sn, N, P, B, Al, Ga, In, O, S, Se, Te, F, Cl, Br, I; R=H, a $C_1$ to $C_5$ linear, branched or cyclic alkyl, or a heteroalkyl; $R^1$ to $R^4$ are independently H, $C_1$-$C_4$ linear, branched or cyclic alkyls; m=0 to 4; y=1 to 4.

5. The method of claim 1, wherein the heteroalkylcyclopentadienyl Indium(I) precursor is $In(Cp(CH_2)_3NMe_2)$.

6. The method of claim 1, wherein the heteroalkylcyclopentadienyl Indium(I) precursor is $In(CpPiPr_2)$.

7. The method of claim 1, further comprising the step of delivering into the reactor a co-reactant.

8. The method of claim 7, wherein the co-reactant is an oxidizing agent selected from $O_2$, $O_3$, $H_2O$, $H_2O_2$, NO, $N_2O$, $NO_2$, O radicals, alcohol, silanols, aminoalcohols, carboxylic acids, para-formaldehyde, or mixtures thereof.

9. The method of claim 7, wherein the co-reactant is $O_3$ or $O_2$.

10. The method of claim 7, wherein the co-reactant is a nitrogen-containing reducing agent selected from $NH_3$, $N_2$, $H_2$, $N_2/H_2$, $H_2$ and $NH_3$, $N_2$ and $NH_3$, $NH_3$ and $N_2H_4$, NO, $N_2O$, amines, diamines, cyanides, di-imines, hydrazines, organic amines, pyrazoline, pyridine, primary amines such as methylamine, ethylamine, primary amines; secondary amines; tertiaryamines, or mixture thereof.

11. The method of claim 7, wherein the co-reactant is $NH_3$.

12. The method of claim 1, wherein the Indium-containing film is $In_xO_y$, InSnO (ITO), InGaZnO (IGZO), InN, InP, InAs, InSb or $In_2S_3$.

13. The method of claim 1, wherein the Indium-containing film contains a second element selected from P, N, S, Ga, As, B, Ta, Hf, Nb, Mg, Al, Sr, Y, Ba, Ca, As, Sb, Bi, Sn, Pb, Co, Zn, one or more lanthanides, or combinations thereof.

14. The method of claim 1, wherein the substrate is a powder comprising one or more of NMC (Lithium Nickel Manganese Cobalt Oxide), LCO (Lithium Cobalt Oxide), LFP (Lithium Iron Phosphate), and other battery cathode materials.

* * * * *